(12) United States Patent
Mangold et al.

(10) Patent No.: US 8,390,790 B2
(45) Date of Patent: Mar. 5, 2013

(54) METHOD AND APPARATUS FOR REPRODUCING A PROGRAMMABLE MASK ON A SUBSTRATE

(75) Inventors: Alexander Mangold, Ludwigshafen (DE); Udo Becker, Heiligkreuzsteinach (DE); Steffen Diez, Heidelberg (DE); Roland Kaplan, Heidelberg (DE)

(73) Assignee: Heidelberg Instruments Mikrotechnik GmbH, Heidelberg (DE)

( * ) Notice: Subject to any disclaimer, the term of this patent is extended or adjusted under 35 U.S.C. 154(b) by 508 days.

(21) Appl. No.: 12/594,700

(22) PCT Filed: Apr. 4, 2008

(86) PCT No.: PCT/EP2008/002710
§ 371 (c)(1),
(2), (4) Date: Oct. 5, 2009

(87) PCT Pub. No.: WO2008/122419
PCT Pub. Date: Oct. 16, 2008

(65) Prior Publication Data
US 2010/0091256 A1    Apr. 15, 2010

(30) Foreign Application Priority Data
Apr. 5, 2007 (DE) .................. 10 2007 016 926

(51) Int. Cl.
G03B 27/32 (2006.01)
G03B 27/42 (2006.01)
G03B 27/54 (2006.01)

(52) U.S. Cl. ................ 355/77; 355/53; 355/67

(58) Field of Classification Search ............ 250/492.2, 250/492.22; 355/53, 67, 77; 430/5, 311
See application file for complete search history.

(56) References Cited

U.S. PATENT DOCUMENTS
(Continued)

FOREIGN PATENT DOCUMENTS
DE  103 17 050      11/2003
JP  2005-057288     3/2005
(Continued)

OTHER PUBLICATIONS

Choksi N., et al.; "Maskless extreme ultraviolet lithography", Journal of Vacuum Science and Technology, Part B, AVS/AIP, Mellville, NY, NY, US, vol. 17, No. 6, Nov. 1, 1999, pp. 3047-3051.

(Continued)

*Primary Examiner* — Hung Henry Nguyen
*Assistant Examiner* — Colin Kreutzer
(74) *Attorney, Agent, or Firm* — Jordan and Hamburg LLP (57) ABSTRACT

A pattern, is imaged by means of a programmable mask, on a substrate that has a photosensitive layer, illumination spots being produced on the mask by means of an illumination unit and individual pixels being produced, via an optical unit, forming a grid of pixels on the substrate corresponding to the pattern. Structure edges that are to be reproduced on the substrate are positioned optimally. To this end at least two exposure processes for the photosensitive layer are performed, the illumination spots or exposure points of which are offset from one another. Thereby, spaces in the grid of pixels of the first exposure process, which spaces are proportionate to the number of exposure processes to be effected, are filled with pixels by the subsequent exposure processes.

13 Claims, 6 Drawing Sheets

U.S. PATENT DOCUMENTS

| | | |
|---|---|---|
| 6,291,110 B1 | 9/2001 | Cooper et al. |
| 6,831,768 B1 | 12/2004 | Cebuhar et al. |
| 7,180,575 B2 | 2/2007 | Kasumi et al. |
| 7,405,414 B2 | 7/2008 | Sandstrom |
| 8,194,242 B2 | 6/2012 | Derksen et al. |
| 2005/0122495 A1 | 6/2005 | Kaplan et al. |
| 2006/0269116 A1* | 11/2006 | Makarovic et al. ........... 382/141 |

FOREIGN PATENT DOCUMENTS

| | | |
|---|---|---|
| JP | 2005-513770 | 5/2005 |
| JP | 2006-128194 | 5/2006 |
| JP | 2007-043152 | 2/2007 |

OTHER PUBLICATIONS

Paufler, J., et al.; "Continuous Image Water with improved image quality for high accuracy optical patterning", 17th European Conference on Mask Technology for Integrated Circuits and Microcomponents, Uwe F. W. Behringer, Editor, Proceedings of SPIE, vol. 4349, (2001), pp. 51-59.

* cited by examiner

METHOD AND APPARATUS FOR REPRODUCING A PROGRAMMABLE MASK ON A SUBSTRATE

BACKGROUND OF THE INVENTION

The invention relates to a method and apparatus for reproducing a programmable mask on a substrate.

Standard photolithography methods reproduce a template pattern, which is pre-produced on a mask, in a fixed reproduction ratio on a substrate by means of photolithography methods. To this end, the mask is illuminated from behind, and a fixed optical unit is used to apply the image to a substrate that has a photosensitive layer on a support material. Illumination radiation selectively exposes this layer using covered areas of the mask, the mask being reproduced when the photosensitive layer is developed. Depending on the application, the reproduction can be the actual finished product, or it can also be used for selectively processing materials layers disposed thereunder corresponding to the openings produced in the layer. Such mask-reproducing photolithography methods are used for instance for producing printed circuit boards or flat screens. The masks to be reproduced include small structures, such as for instance conductors or generally geometric structures that are to be reproduced or copied onto the substrate. The typical size of such structures is a function of the application and currently is for instance 10 to 50 µm in the printed circuit board industry. Structure sizes down to 1 to 2 µm are used when producing flat screens. In current standard methods the masks are generally present in the form of films, emulsion masks, chromium masks, or the like as complete templates of the entire pattern that are transferred 1:1 to the substrate. The disadvantage of this method is that a discrete mask must be produced for each pattern that is to be reproduced, and that the masks are subject to wear over time due to loading and unloading.

Therefore, known from U.S. Pat. No. 6,291,110 B1 is a novel method in which integrated into the reproduction system and provided as the template is a programmable unit or mask into which the data to be reproduced are fed during the copying process and by which these data are depicted. The electromagnetic illumination that passes through the mask, and thus the structures to be reproduced, are reduced in size by means of a reproducing optical unit that is arranged between the mask and the substrate. A programmable mask can be smaller than the substrate, and it is nevertheless possible to expose large substrates by joining template segments programmed into the mask. Thus no large surface-area mask retention unit is necessary. The illumination unit and the reproducing optical unit may also be designed only for small surface areas. LCDs, micro-mirror arrangements or phase shift arrangements in one-dimensional or two-dimensional arrangements may be used for programmable masks, inter alia. By means of absorption, reflection, or diffraction controlled pointwise within the strip or surface area, the intensity of the radiation used for exposure can be controlled with these elements in order to produce exposed or unexposed areas. The illumination intensity can be regulated pointwise in stages or continuously, so that it is also possible to produce grayscale values.

One property of programmable masks is that they can only provide the template at a specific resolution that is determined by the size of the functional units, hereinafter called pixels. The term "resolution" is used herein to indicate the accuracy with which the edge positions of structures can be defined. While the position accuracy with which structure edges are reproduced is solely a function of the resolution limit for the optical unit when using conventional masks, the resolution of the reproduction is determined by the pixel size and the resultant object grid when employing programmable masks in combination with a 1:1 reproduction.

Another photolithography method that is described in DE 103 17 050 A 1 concerns the issue of distortion in the substrate. Generally used for substrates, in particular in printed circuit board production, are substrates that have a large surface area relative to their thickness, which is in the range of several mm (millimeters) to a few µm (micrometers). Frequently there must be a plurality of structurings on these substrates, and the production steps between these structurings can involve high temperatures differences or mechanical stresses that can lead to deformation of the substrate surface. In order to be able to expose a second layer of structures cleanly over the first layer such that the structures that belong together coincide, in this method the distortion of the substrate is calculated by means of detecting the position of alignment markings that are present using camera images and is compensated during exposure. In this method, the structures of a mask are illuminated by point and reproduced on the substrate in a distorted manner according to previously acquired data regarding the distortion correction such that the distortion of the substrate is compensated and the alignment markings for the mask coincide with those for the substrate. In this method, mask and substrate are connected to one another at a fixed distance using a mechanical apparatus and the illumination unit and the distortion-compensating reproduction unit, which transfers the image of the mask to the substrate and which is itself coupled securely to the illumination unit, move relative thereto. Movable optical components are used in the reproduction unit for compensating distortion.

SUMMARY OF THE INVENTION

Proceeding herefrom, the underlying object of the invention is to further refine the generic method such that improved and/or high resolution and/or high throughput is attained. In particular structure edges that are to be reproduced on the substrate should be positioned optimally. Moreover, the reproduction method that is distortion-compensated in accordance with the aforesaid DE-A1 should be expanded such that it can be used for reproducing at least one programmable mask. Furthermore, an apparatus should be proposed for performing the method, which apparatus permits optimized resolution and/or high throughput and/or exact positioning of structure edges along with a simple and also reliably functional structure. Moreover, the use of such an apparatus is proposed in order to attain optimum resolution and/or high throughput and/or exact positioning of structure edges on the substrate.

For improving the positioning resolution of structure edges, it is inventively proposed that the programmable masks be loaded with enlarged template data and that in the reproduction optical unit these data be reduced in size to the required image grid. The template data are enlarged by a specified or specifiable factor with regard to the required image data and/or the image grid of the substrate. Then preferably the size is reduced in accordance with the image data and/or the image grid on the substrate, in particular by means of the optical unit and/or the optical reproduction and correction unit. The aforesaid factor is preferably specified in the range of 1.4 to 5, advantageously in the range of 1.6 to 3.5, usefully in the range of 1.8 to 2.5, and in particular is essentially 2. The reduction factor for the optical unit and/or the optical reproduction and correction unit, which is arranged in the beam path of the electromagnetic radiation of the illumination unit downstream of the programmable mask, is advantageously essentially the same as the aforesaid enlargement factor. If the apparatus is used to produce an illumination spot on the programmable mask by means of the illumination unit, the illumination spot is larger than the individual reproduction reproduced on the substrate by means of the optical unit and/or reproduction and correction unit after corresponding reduction in size. It is expressly stated that for the inventive method, and for the apparatus and its use, the correction of any distortions is not necessarily required, but rather only the reduction in size is necessary, preferably by the aforesaid enlargement factor, by means of the optical unit and/or the optical reproduction and correction unit. Furthermore, in the context of the invention the enlargement factor is adapted to and/or coordinated with the template data, in particular the grid of the programmable mask that is employed. It is furthermore stressed that in accordance with the invention the pattern data to be reproduced are read into the programmable mask and are reproduced by means of the preferably distortion-compensating optical unit, specifically using multiple interlocking exposures for increasing image resolution and/or optimizing the positioning of the structure edges.

Preferably the increase in resolution is furthermore attained in that the programmable mask is adjusted on structural edges such that the intensity of the exposure radiation after passing through the mask corresponds to the measure in which the original template structure would fill the corresponding grid field. The reproductions must overlap the individual grid points so that this adjusted intensity can appropriately influence the edge position of structures. To this end, in accordance with the invention at least two exposures of the same photo-sensitive layer and/or of the same photo-sensitive resist layer occur, whether in at least two exposure processes performed temporally successively or in at least two exposure processes performed simultaneously using programmable masks working in parallel and preferably movable optical components and/or in particular optical units. The exposure grid is specified extended and/or enlarged with the same number of exposure spots, the number of exposure processes performed temporally successively being increased in the same ratio or the number of exposure processes performed simultaneously being increased in the same ratio. The reproduction grid is specified such that it is larger than the image grid that is desired, in particular it is twice as large and/or corresponds to the number of exposure processes. The image points and/or the pixels of the at least two illumination processes are specified spatially offset to one another, specifically such that the flank of the entire or composite intensity assigned to a structure edge and/or provided for producing and/or positioning a structure edge increases or decreases continuously on the substrate. Discontinuities in the flank steepness are avoided according to the invention. The flanks are in particular produced by overlapping the edge areas of the pixels or of the individual reproductions for forming the structure edges, the intensity for positioning the structure edge being specified and in particular reduced for at least one of the aforesaid pixels or individual reproductions. The intensity of the pixels or individual reproductions forming the structure is specified such that the composite intensity of the radiation of the substrate and/or of the photo-sensitive layer and/or resist layer irradiated jointly in at least two exposure processes exceeds the threshold value for exposure. In accordance with the invention, the flank steepness is continuously specified in a specified area in which the flank intersects the threshold value.

Thus with two exposure processes, for instance, during the first exposure every second grid point for the template and/or the programmable mask is exposed and in a similar manner the grid points that were previously omitted are exposed in the subsequent and/or second exposure process. The intensity of the illumination is specified such that only after all of the exposure processes have been performed on the locations on the same photo-sensitive layer or photo-sensitive resist layer to be exposed is the dosage necessary for through exposure of the photo-sensitive surface of the substrate exceeded. At those points on the image grid at which in the object grid an adjusted intensity is used for depicting the limits using exposed structures, the dose finally drops below the limit within the grid field and thus the structure edge strikes at a location that is disposed between the limits of the grid. The exact position depends on the intensity that is set, in particular on the intensity of the illumination spot and/or the individual reproduction, which are associated with the structure edge and/or by means of which the structure edge is produced. The individual reproductions projected onto the substrate and/or onto the photo-sensitive layer have edge areas in which the radiation intensity of the individual reproductions or reproduction elements is smaller than in the center. The individual reproductions have an intensity distribution or an intensity profile such that the intensity decreases in the edge area in comparison to a central area, for instance like a Gauss bell curve or like a trapezoid. The individual reproductions of the exposure processes performed temporally successively or simultaneously are provided spatially offset to one another such that for the area of the structure edge the edge areas of the individual reproductions and/or pixels of the aforesaid exposure processes are overlaid, the size being reduced at least for one of the aforesaid individual reproductions and/or pixels. The position of the structure edge is specified corresponding to the specified and/or adjusted intensity of the pixels or individual reproduction associated with the structure edge.

The invention is explained in greater detail in the following using the drawings, but this shall not constitute a limitation.

DETAILED DESCRIPTION OF THE INVENTION

Figure 1:
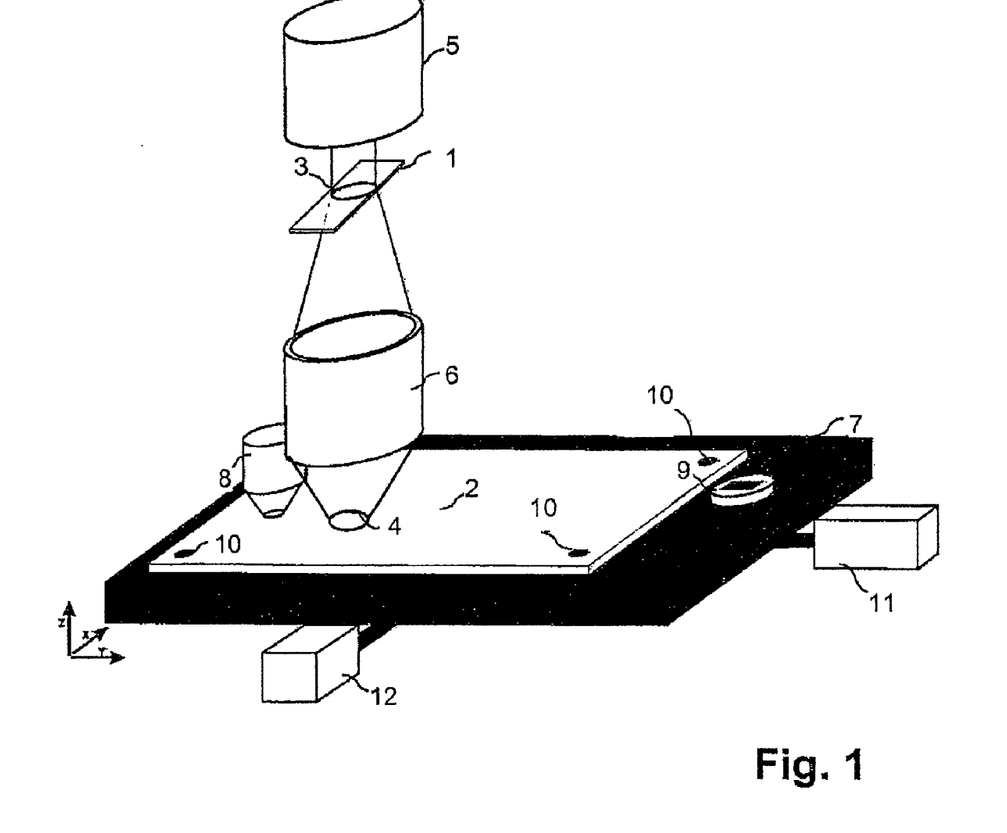
FIG. 1 is an elevation of the apparatus.

In accordance with the exemplary embodiment of the inventive apparatus depicted in FIG. 1, the substrate 2 is arranged on a table 7 that can be moved by means of the two drives 11 and 12 in two orthogonal directions relative to one another in an X/Y plane in a manner known per se, and specifically relative to the other, components, which are preferably stationary, such as the illumination unit 5, the programmable mask 1, and the optical unit 6. It is expressly stated that, both for the apparatus and for the proposed method, the relative movement between the substrate 2 on the one hand and the programmable mask 1 and the other components on the other hand is the critical factor. Thus in the context of the invention the substrate 2 can be arranged stationary while the other components, in particular the programmable mask 1, can be moveable by means of suitable adjusting units, drives, etc. relative to the substrate 2 that is arranged stationary. In particular a partial area of the mask 1 is reproduced on the substrate 2, the illumination spot 3 being produced on the programmable mask 1 by means of the illumination unit 5 and as an individual reproduction 4 on the substrate 2. The optical unit 6 includes a reproduction and correction unit and is disposed in the optical path between the programmable mask 1 and the substrate or image element 2. Arranged on the substrate support and/or the X/Y table 7 is an alignment marking or adjustment camera 9, in particular for aligning to a standard position and/or with respect to the optical unit 6. Moreover, the substrate 2 has registration markings 10 that are detected in particular for adjusting the optics path by means of the substrate camera 8, control values being formed that are used in particular as offset values for the correction calculation and/or aligning the substrate 2 on the substrate support 7 or for aligning the optical unit 6 in a control unit (not depicted in greater detail herein). For producing an electromagnetic radiation field, the illumination unit 5 includes a radiation source or a radiation source for electromagnetic radiation, in particular a laser, is upstream of the illumination unit 5. The programmable mask 1 can be irradiated or illuminated in one shot using the illumination unit and/or illumination spots can be produced on the programmable mask. The illumination spots are disposed in a specified grid and/or array on the mask.

Figure 2:
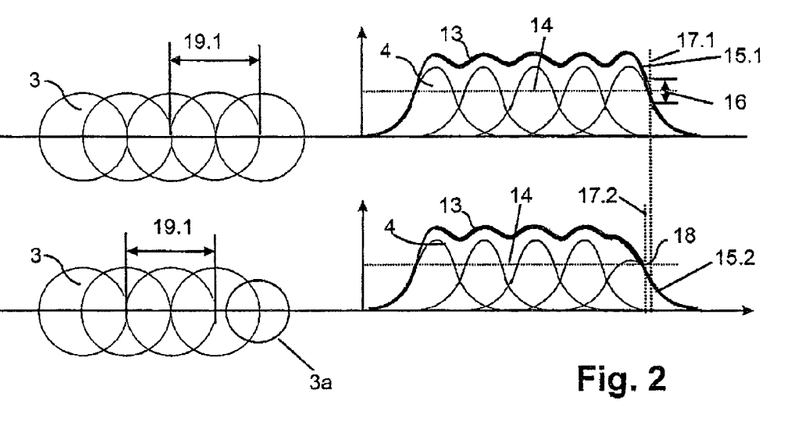
FIG. 2 depicts overlaid illumination spots and the composite intensity of the individual reproductions or pixels on the substrate.

FIG. 2 depicts the method steps for producing a structure, the steps occurring by means of the programmable mask, the illumination spots 3 being depicted on the left, and the pixels 4, which are reproduced on the substrate or its photosensitive layer, and their composite intensity 13 being depicted on the right. In the pixel grid 19.1, first illumination spots 3 are provided in one line very closely adjacent to one another, and additional illumination spots having the same pixel grid 19.1, but offset by one-half of a pixel grid, are associated with and/or overlaid thereon. The line corresponds to a column or row in the pattern to be reproduced, which overall has a plurality of columns and rows in an array and/or grid. The pixels 4 have a bell-shaped intensity curve, like a type of Gauss bell distribution curve, the intensity being lower in the edge areas than in the center. The composite intensity 13 depicted at the top of FIG. 2 has corresponding lateral flanks 15.1. The radiation intensity of the illumination spots and thus also of the pixels 4 is coordinated to the photoresist or in general to the photo-sensitive layer such that its threshold value 14 intersects the lateral flanks 15.1 at exposure, and specifically preferably in an area 16 having a continuous increase in the flank 15.1. The flank 15 is produced by overlaying the pixels, which are spatially offset in the aforesaid line or in a column or row, the intensity of at least one edge-side pixel, in this case pixel 3a, being changed for positioning the structure edge. The point of intersection thus defines the position of the resist edge and/or the structure edge 17.1.

As depicted at the bottom of FIG. 2, the illumination spot 3a present at the right-hand edge of all of the illumination spots has a lower illumination intensity than the other illumination spots 3. Thus the composite intensity at the right-hand edge is reduced corresponding to the flank 15.2, so that a displacement 18 of the resist edge or structure edge 17.2 is attained. In accordance with the invention it is of special significance that the threshold 14 and the illumination intensities are coordinated with one another such that the change and in particular the reduction in the illumination intensity for the edge-side illumination spot 3a occurs in that the intersection point for the threshold 14 is in the area 16 in which the flank steepness is continuous and/or changes, that is, there are no discontinuities. In accordance with the invention the displacement 18 occurs by changing and in particular reducing the illumination intensity of the edge-side illumination spot 3a, and ultimately the exact positioning of the resist edge, and thus the structure edge 17, occurs.

Figure 3:
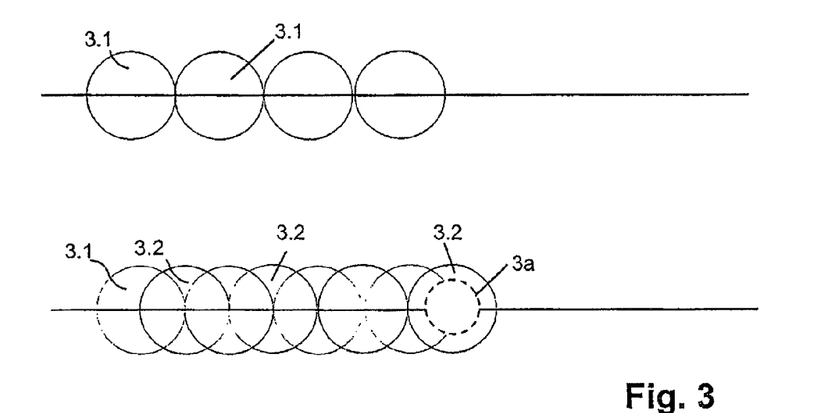
FIG. 3 depicts illumination spots for two illumination processes.

FIG. 3 depicts the two exposure processes, the illumination spots 3.1 of the first exposure process being depicted at the top and the illumination spots 3.2 of the second exposure process being depicted at the bottom, specifically the latter spatially offset to the illumination spots 3.1 by one-half of the pixel grid. The edge-side illumination spot 3a is indicated with the broken line, and it is established that when the illumination intensity is increased, specifically at maximum illumination intensity, correspondingly the edge-side illumination spot 3a is disposed very closely adjacent to the adjacent illumination spot of the second exposure process.

Instead of the aforesaid closely adjacent arrangement, it is expressly stated at this point that the illumination spots can also be specified such that the edge areas overlap, which will be explained in the following using FIG. 8 for distortion correction, or even can have specified distances from one another. Furthermore, the intensities of the illumination spots can have different contours, for instance trapezoidal contours or contours with straight or curved flanks. The critical factor is that the composite intensity across the entire width of the structure to be produced is greater than the threshold of the photo-sensitive layer and in addition the side flanks have the area with continuous flank steepness in order to specify a defined intersection point with the threshold.

Figure 4:
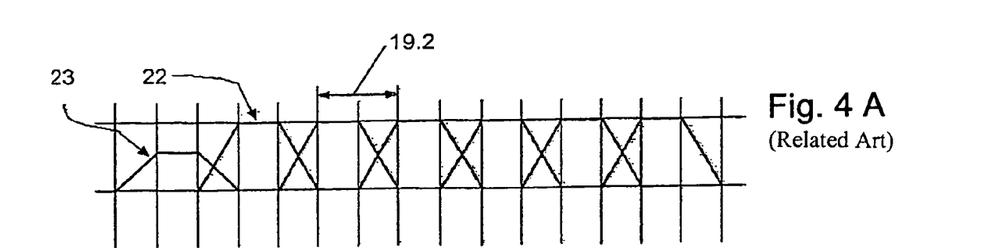
FIGS. 4A and 4B depict pixels reproduced in a specified grid and their composite intensity on the substrate.
Figure 5:
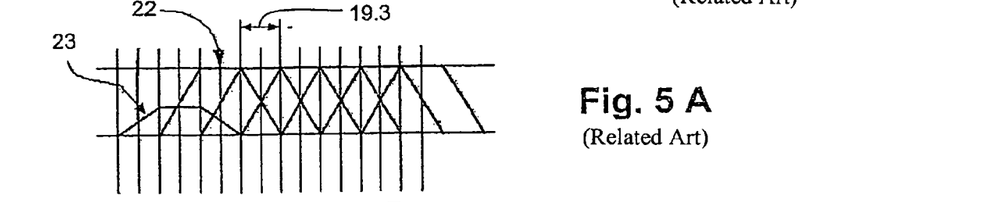
FIGS. 5A and 5B depict pixels reproduced in a finer grid and their composite intensity on the substrate.

The inventive manner of action and functioning are explained using FIGS. 4 and 5, but these are not the subject-matter of the invention. Since the reproduction scale, the image field, the resolution, and the overlapping cannot be set independently, there is typically a situation as illustrated in FIG. 4A. The pixels reproduced in the specified grid 19.2 are only partially overlapping. If an edge-side pixel or edge pixel 23 drops in intensity relative to the interior pixels 22, in accordance with FIG. 4B there is an unfavorable intensity curve 13 on the substrate. The structure edge on the substrate is defined by the intensity radiated in and the minimum intensity of the threshold 14. In accordance with FIG. 4B, the flank on the left with the composite intensity 13 has an area 16.2, the exposure intensity of which is nearly at or is at the threshold 14, and consequently the structure edge in the area 16.2 is not clearly determined. The area 16.2 is a discontinuity in the flank steepness so that a defined intersection point with the threshold 14 is not possible, and thus defined positioning of the structure edge is not possible.

In order to circumvent this disadvantageous situation, in the past it was proposed that the resolution be kept the same and that the reproduction scale be changed such that in accordance with FIG. 5A there is a finer grid 19.3 and the pixels overlap more. In this arrangement in accordance with FIG. 5B the composite intensity 13 has a clear intersection with the threshold 14 that is typical for the resist. This results in a clear displacement 18.3 of the structure edge by the edge-side pixel 23 that has dropped in intensity. The disadvantage of this method, however, is the sharp reduction in throughput, because proportionally more individual reproductions must be performed due to the finer grid.

Figure 6:
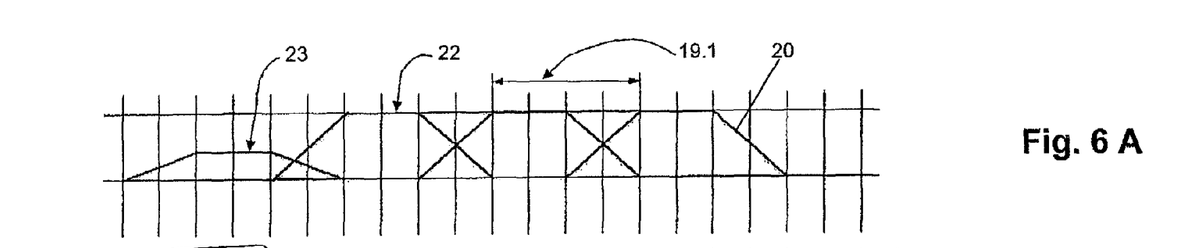
FIGS. 6A, 6B and 6C depict the exposure spots or pixels inventively specified for two exposure processes, with an extended exposure grid and composite intensity on the substrate.

In order to circumvent this disadvantage, in the context of the invention it is proposed that the reproduction scale be reduced and the image surface and/or the structure and/or its photo-sensitive layer be exposed multiple times, as depicted in FIG. 6. First, in accordance with FIG. 6A unsatisfactory overlapping of the pixels 22 and 23 results from the extended pixel grid 19.1. However, a favorable composite intensity 13 is attained in accordance with FIG. 6C using the second exposure in accordance with FIG. 6B, with the same grid 19.1, but spatially offset in the line or column or row. Without a drop in intensity for the edge-side pixel 23, the composite intensity 13 has the flank 15.1 with a uniform flank steepness. By reducing the intensity of the edge pixel 23, the lateral flank 15.2 is produced, and it intersects the threshold 14 in a defined manner. Thus, by changing the illumination intensity for the edge pixel 23 from the maximum value to the value that has been reduced corresponding to FIG. 6A, a defined displacement 18 of the resist edge and the structure edge occurs. The structure edge can thus be positioned in a defined manner. In this arrangement, the intersection point of the composite intensity 13 is defined with the resist threshold and thus the structure edge is clearly defined. The position of the structure edge is thus no longer determined using pixel size and object grid, but rather in accordance with the invention the structure edge can be positioned within the grid field corresponding to the size of the displacement or displacement area 18 so that a significant improvement in resolution is attained. At the same time, the throughput was not reduced because the doubled surface was exposed two times.

The number of twice overlaid exposure processes does not represent a limitation on the invention, but rather more frequent exposure processes can be used, as well. Furthermore, a plurality of separate beam paths can be used for the at least two overlaid exposure processes. For attaining high resolution and high throughput, regardless of whether the exposure processes are performed temporally successively or the exposure process are performed simultaneously, in particular by means of programmable masks working in parallel, in accordance with the invention the exposure grid is extended with the same number of exposure points. It is furthermore established that the reproduction grid is at least twice as big as the desired image grid. Moreover, as explained in the foregoing, it is of particular advantage to specify the template data for the programmable mask larger by a specified factor as the required image data and/or of the image grid of the substrate. Attained in the context of the invention by means of the reduction on the substrate, correspondingly specified by the optical unit, on the substrate.

There is a proportional increase in throughput if the inventive overlaying method described in the foregoing is realized using a plurality of beam paths.

Figure 7:
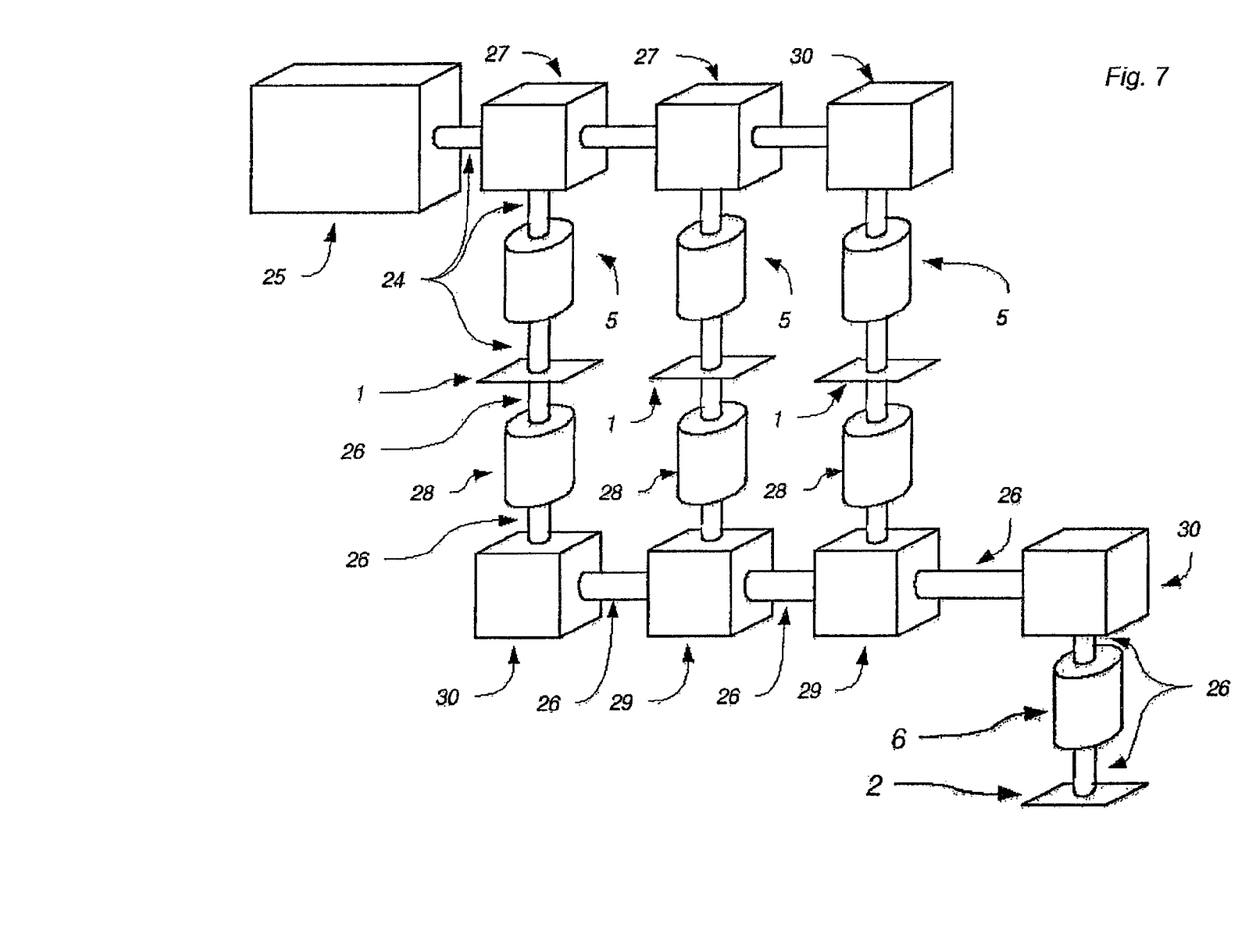
FIG. 7 depicts another exemplary embodiment with programmable masks that work in parallel.

FIG. 7 depicts one apparatus for a plurality of beam paths working in parallel. At a suitable wavelength for exposing the photosensitive layer or the photo resist, the electromagnetic radiation 24 from the source 25 is split by means of the units 27 for beam splitting and illuminates a plurality of programmable masks or modulators 1 using each of the illumination units 5. The spatially modulated radiation field 26 and/or each of the radiation fields 26 are preferably combined via the reproduction optical units 28 using an image overlaying optical unit 29, at least one unit 30, usefully in accordance with the drawing a plurality of units, furthermore being provided for image deflection. Moreover, the spatially modulated radiation field produces the composite intensity curve on the substrate 2 by means of the optical unit 6.

Figure 8:
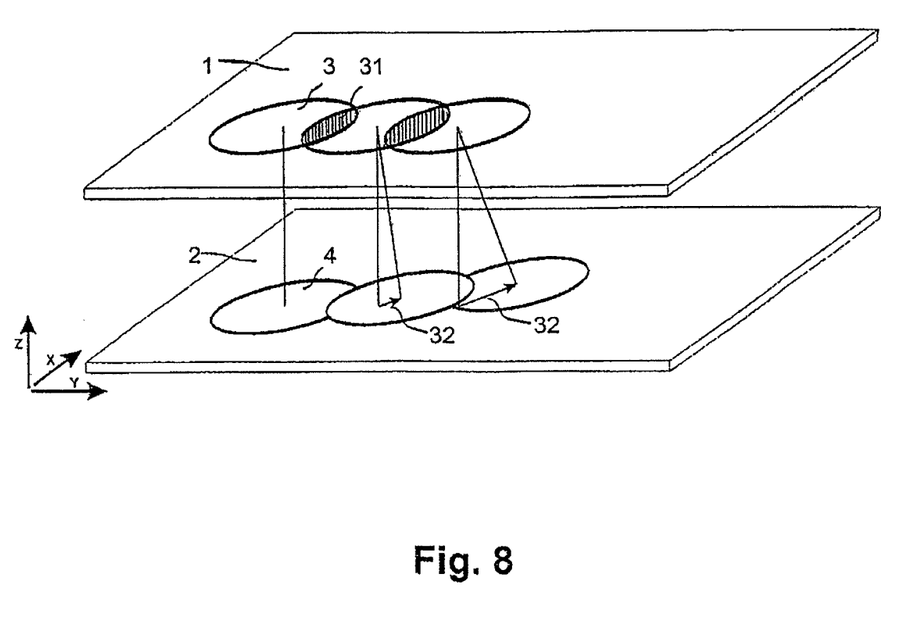
FIG. 8 illustrates the principle for a correction or image distortion by joining individual reproductions together.

FIG. 8 depicts the principle of the apparatus and the method steps for compensating distortions or warpage in the substrate by joining individual reproductions 4. A portion of the programmable mask 1 is reproduced on the substrate 2, an illumination spot 3 being produced on the mask 1 by means of the illumination unit and being reproduced on the substrate 2 as an individual reproduction 4. The entire reproduction constitutes overlapping individual reproductions 4, each individual image here being for the sake of simplicity an undistorted 1:1 reproduction of the mask or of the associated illumination spot 3. It shall be mentioned at this point that instead of this, in the inventive method enlarged template data and/or where necessary enlarged illumination spots may be provided that are appropriately reduced in size by means of the optical unit that is arranged between the programmable mask 1 and the substrate 2. Distortion of the entire reproduction is provided by displacing the individual reproductions 4 on the substrate using a correction vector 32. The substrate 2 is measured by measuring markings, such as in particular registration markings or alignment markings on the mask 1 and/or substrate 2 or by prescribing distortion values. Furthermore, a combination of measured values and set values is also possible in a preferred manner. Based on the measurement, the relative positions of markings for the substrate and/or the mask are determined, the reproduction being compensated and/or displaced corresponding to the detected and/or calculated and/or pre-determined distortions for compensating them by means of the correction vector 32.

If the illumination spots 3 disposed adjacent to one another have common overlapping areas 31, the displacement and/or correction in the overlapping area causes blurring, the maximum offset of two adjacent individual reproductions 4 being specified according to a tolerable blurring and the size of the overlapping area 31. It should be noted that in accordance with the invention, in the apparatus and the method the illumination unit and the optical unit are moved relative to the programmable mask 1 and/or the substrate 2, distortions on the substrate furthermore being detected. Depending on the detected distortions, the reproduction of the programmable mask and/or partial areas thereof are distorted by means of the optical unit and adapted to the distortions on the substrate. Depending on the distortions in the substrate 2, the individual reproductions corresponding to each of the illumination spots are preferably displaced overlapping on the substrate and/or continuously joined to one another. The illumination intensity of the illumination spots is usefully specified smaller in the edge areas by a defined amount than in the center of the illumination spot, which in particular has an intensity distribution corresponding to a Gauss bell curve.

In addition, it is established that in the inventive method, whether for defined positioning of structure edges alone or in combination with the distortion compensation, the movement of the illumination spot or points 3 on the programmable mask constitutes two movements, preferably from one rapid scanning movement of the illumination and one slower, in particular orthogonal movement. Furthermore, the correction of the individual reproductions on the substrate 2 is controlled corresponding to the position of the illumination spot 2 on the programmable mask, the movement being taken into account for correcting and/or controlling the illumination spot corresponding to the correction vector 32.

The invention claimed is:

1. Method for imaging a pattern, comprising generating, by means of an illumination unit, light spots on a programmable mask, the programmable mask being situated over a substrate comprising a photosensitive layer, producing by impingement of the light spots on the photosensitive layer, through an optical unit, individual pixels in a grid array, each pixel corresponding to an exposure point on the photosensitive layer, the pixels comprising an image corresponding to the pattern, wherein at least two exposure processes for the photosensitive layer are performed, the light spots for each exposure process being offset from the light spots for the other, the grid including spaces between the pixels in proportion to the number of exposure processes and the number of exposure points and, hence, pixels produced by the exposure processes is in proportion to the number of exposure processes and the exposure processes are effected simultaneously by means of a respective programmable mask for each exposure process.

2. Method according to claim 1, wherein the exposure processes are effected successively.

3. Method according to claim 1, wherein the exposure processes include use of movable optical components.

4. Method according to claim 3, wherein the pattern is produced in segments with distortion compensation.

5. Method according to claim 1, wherein the patterns produced by the exposure processes are formed on the same area on the photosensitive layer.

6. Method according to claim 1, wherein the patterns produced by the exposure processes are formed on respective different areas on the photosensitive layer.

7. Method according to claim 1, wherein the pattern includes a structure defining an edge corresponding to an edge of the photosensitive layer and pixels produced at the edge have a lower illumination intensity than the other pixels.

8. Method according to claim 7, wherein the intensity of the illumination of the pixels in a zone adjacent the edge decreases continuously and the illumination impinges on the photosensitive layer along a predetermined line corresponding precisely to the position of the edge.

9. Apparatus for imaging a pattern through an exposure process in accordance with claim 1, comprising a programmable mask, an illumination unit for generating light spots on the mask, a substrate comprising a photosensitive layer, an optical unit in an optical path between the mask and the photosensitive layer for producing by impingement of the light spots on the photosensitive layer a grid of pixels corresponding to the pattern, the pixels being spaced from each other, the mask and illumination unit, on the one hand, and the substrate, on or the other hand, being movable relative to each other in a plane parallel to a plane of the photosensitive layer so that by at least one repetition of the exposure process the number of pixels in the grid can be increased in proportion to the number of exposure processes, by filling spaces in the grid.

10. Apparatus according to claim 9, further comprising resist forming an edge of the photosensitive layer and wherein intensity of the light spots produced by the illumination unit is adjustable so that by repetition of the exposure process pixels respectively of lower intensity at the edge and of higher intensity not at the edge can be produced.

11. Method according to claim 1, wherein each of the programmable masks comprises predetermined pattern data that is larger in dimension than that which is produced as the pattern on the substrate, and in which the programmable mask pattern data is enlarged by a predetermined factor relative to the pattern and/or the projection thereof onto the substrate and reduced within the optical unit and/or by an optical correction unit in accordance with the pattern and/or projection thereof on the substrate so as to define a positioning and resolution thereof at edges of the image corresponding to the pattern and edges of the pattern.

12. Method according to claim 1, wherein respective pixels of the at least two exposure processes are spatially shifted relative to one another by a predetermined interval so that an intensity at a flank defining an edge of the pattern imaged onto the substrate continuously increases or decreases.

13. Method according to claim 12, wherein a respective flank comprises an overlapping edge region of each one of respectively adjacent pixels imaged by the at least two exposure processes, and in which an intensity of the illumination of one of the adjacent pixels is lower than an intensity of the illumination of the other of the adjacent pixels.

* * * * *